United States Patent [19]

Langevin et al.

[11] Patent Number: 5,686,135
[45] Date of Patent: Nov. 11, 1997

[54] METHOD OF FORMING AN ELECTRICALLY CONDUCTIVE CONTACT ON A SUBSTRATE

[75] Inventors: Alain Langevin; Benoit Auger; Charles Casavant; Wolfgang Erat, all of Granby, Canada

[73] Assignee: Circo Craft Co., Inc., Kirkland, Canada

[21] Appl. No.: 99,531

[22] Filed: Jul. 30, 1993

Related U.S. Application Data

[63] Continuation of Ser. No. 782,827, Oct. 25, 1991, abandoned.

[51] Int. Cl.$^6$ ............................................. B05D 5/12
[52] U.S. Cl. ..................... 427/96; 427/259; 427/261; 427/265; 427/282; 29/830; 29/846
[58] Field of Search .................. 427/96, 282, 259, 427/261, 265; 29/830, 846

[56] References Cited

U.S. PATENT DOCUMENTS

| | | | |
|---|---|---|---|
| 4,683,653 | 8/1987 | Iwasa | 29/830 |
| 4,725,478 | 2/1988 | Mathias | 427/96 |
| 4,747,211 | 5/1988 | Gilles | 427/96 |
| 4,767,892 | 8/1988 | Kohari | 29/846 |
| 4,837,050 | 6/1989 | Iwasa | 427/96 |
| 4,882,839 | 11/1989 | Okada | 427/96 |
| 5,517,756 | 5/1996 | Shirai et al. | 29/846 |

FOREIGN PATENT DOCUMENTS

| | | |
|---|---|---|
| 0203544 | 12/1986 | European Pat. Off. . |
| 890226273 | 8/1989 | Japan . |
| 3-89416 | 4/1991 | Japan . |

*Primary Examiner*—Katherine A. Bareford
*Attorney, Agent, or Firm*—Nixon & Vanderhye

[57] ABSTRACT

A method of forming an electrically conductive contact on an insulated substrate such as a printed circuit board includes the step of defining a contact area on the substrate and applying a copper buss on the substrate so that it extends beyond the marginal edges of the contact area. A thin layer of soldermask is then applied to cover the upper surface of the copper buss outside of the contact area and to cover areas of the substrate not covered by the copper buss. Thereafter, a Thick Film Polymer (TFP) conductive paste is applied over the exposed portions of the copper buss and over a small portion of the soldermask so that the copper buss is covered completely.

9 Claims, 4 Drawing Sheets

METHOD OF FORMING AN ELECTRICALLY CONDUCTIVE CONTACT ON A SUBSTRATE

This is a continuation of application Ser. No. 07/782,827, filed Oct. 25, 1991 now abandoned.

FIELD OF THE INVENTION

The present invention relates to a method of forming an electrically conductive contact on a substrate such as for example a printed circuit board.

BACKGROUND OF THE INVENTION

Printed circuit boards (PCBs) are well known in the art and many techniques have been considered to form electrically conductive circuitry thereon. One prior art technique currently used to form switch contacts on a printed circuit board requires that a contact area be defined on the PCB. Once this is done, copper buss is brought into and applied to a small region of the PCB within the contact area. Thick Film Polymer (TFP) conductive paste is then applied over the entire contact area. Thus, the TFP conductive paste covers the areas of the PCB within the defined contact area which are and are not covered by the copper buss.

Although relatively inexpensive switch contacts are formed using this method, a problem exists in that the copper buss projects above the surface of the PCB and is often of a thickness which seriously compromises the application of the TFP conductive paste. In addition, pronounced cracking of the TFP conductive paste often occurs at the edges of the copper buss where a significant height difference is encountered between the planar surface of the PCB and the top surface of the copper buss. This cracking problem arises due to the fact that the TFP conductive paste cannot accommodate this height difference without creating stress points after oven curing.

Other methods of forming PCBs and electrically conductive circuitry contacts thereon have also been considered. In particular, U.S. Pat. No. 4,837,050 to Iwasa et al discloses a method of forming electrically conductive circuits on a substrate which first requires that selected areas of the substrate be covered with a copper lamination or copper conductive paste. A circuit is then formed in the copper lamination by etching and once this is done, a plating resist is applied over all areas of the substrate including the areas which are and which are not covered by copper lamination except predefined portions that are to be electrically connected to a second circuit. A copper paste is then applied over the portions not covered by the resist and on selected areas covered by the resist.

U.S. Pat. No. 4,683,653 also to Iwasa et al discloses a technique for producing a multi-layered printed circuit board and electrically conductive circuits thereon. The method disclosed in this reference requires that a conductive paste be applied to a substrate in selected areas. The substrate is then masked with a photoresist over its entire surface except on the upper surface of the conductive paste. A conductive layer is then placed over the entire upper surface of the conductive paste and the photoresist is removed.

Another technique for manufacturing a multilayered substrate is disclosed in U.S. Pat. No. 4,882,839 to Okada. The method disclosed in this reference requires that a palladium thin film be used to cover wiring located on a substrate. A photoresist is then applied over the thin film and the photoresist is masked to form via formation portions. Conductive resin is then placed in the via formations and the photoresist is removed.

Although these references disclose different techniques to form printed circuit boards and contacts thereon, improved methods to form electrically conductive contacts on substrates such as PCBs are continually being sought.

It is therefore an object of the present invention to provide a novel method of forming an electrically conductive contact on a substrate.

SUMMARY OF THE INVENTION

According to the present invention there is provided a method of forming an electrically conductive contact on a substrate comprising the steps of:

(i) applying a conductive buss on said substrate at a predetermined location;

(ii) applying soldermask to selected areas of the surface of said conductive buss to define a window over said conductive buss spaced from the marginal edges thereof; and (iii) applying a conductive paste on the upper surface of said conductive buss in said window so that the upper surface of said conductive buss is substantially completely covered.

Preferably, the conductive paste covers the window and overlies a portion of the soldermask about the periphery of the window. It is also preferred that that the conductive paste covers at least 0.010 inches of the soldermask from the peripheral edges of the window.

Preferably, a plurality of contact areas are defined on the substrate at the same time and steps (i), (ii) and (xii) of the present process are performed on each defined contact area so that a plurality of electrically conductive contacts are formed on the substrate simultaneously. It is also preferred that the TFP conductive paste is placed on the conductive buss using a machine screening process.

The present method of forming an electrically conductive contact on a substrate provides advantages in that the TFP conductive paste is applied only on the upper surface of the copper buss and a small portion of the soldermask and therefore, over a generally planar surface. This permits the TFP conductive paste to be optimized and the viscosity of it to be formulated for efficient application since the TFP conductive paste is not required to cover a "large" step. Furthermore, since the TFP conductive paste is not required to cover the "large" step, the thickness of the copper buss applied initially to the substrate is no longer a significant manufacturing constraint which affects TFP conductive paste criteria and thereby simplifies the manufacturing process. In addition, since cracking of the TFP conductive paste at the step is eliminated, a benefit is obtained due to the mandatory use of the so-called "no clean fluxes" (CFC reduction) which are left on the substrate after soldering.

BRIEF DESCRIPTION OF THE DRAWINGS

An embodiment of the present invention will now be described more fully with reference to the accompanying drawings in which.

DETAILED DESCRIPTION OF THE PREFERRED EMBODIMENT

Figure 1:
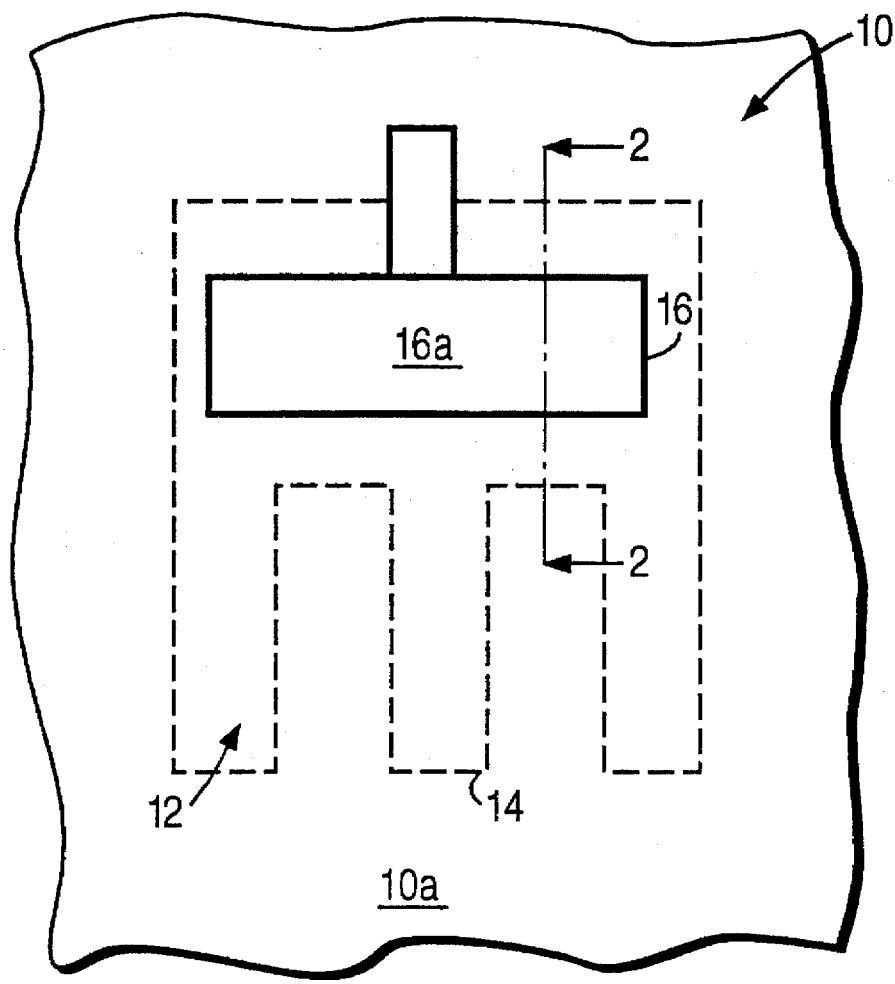
FIG. 1 is a top plan view of a prior art printed circuit board having an electrically conductive switch formed thereon.
Figure 2:
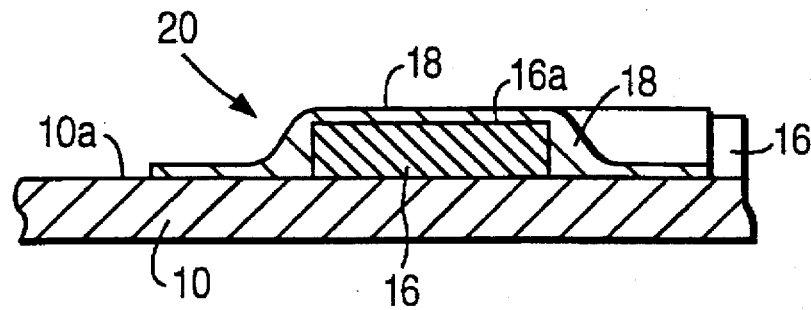
FIG. 2 is a section of the printed circuit board shown in FIG. 1 taken along line 2—2.

For the sake of clarity, a brief description of a prior art method of forming an electrically conductive contact and in this case, a low cost switch contact on a substrate, will firstly be described with reference to FIGS. 1 and 2.

With reference to these figures, a portion of a substrate in the form of a printed circuit board (PCB) is shown and is generally indicated by reference numeral 10. A contact area or Thick Film Polymer (TFP) screen 12 is defined on a region of the substrate 10 as indicated by the dotted line 14. Copper buss 16 is applied on the substrate 10 within the TFP screen 12 and as can be seen is generally much smaller than the area of the TFP screen 12. TFP conductive paste 18 is applied over the copper buss 16 and the substrate 10 in the TFP screen 12 to form a contact area. As is known to those of skill in the art, the contact area is used in conjunction with a conductive elastomeric disc to form a low cost switch contact.

Although a generally inexpensive switch is formed using this method, the TFP conductive paste 18 must traverse a "large" step 20 defined by the planar upper surface 10a of the substrate 10 and the upper surface 16a of the copper buss 16. As described previously, the step 20 causes problems due to the increased probability of cracking occurring in the TFP conductive paste 18 at the step 20 after curing. In addition, the step 20 places composition constraints on the TFP conductive paste 18 and height constraints on the application of the copper buss 16 thereby increasing manufacturing costs.

To simplify the manufacturing process and obviate or mitigate at least some of the problems described above with reference to the prior art method, the present method of forming an electrically conductive contact on a substrate has been conceived and will now be described with reference to FIGS. 3 to 7.

Figure 3:
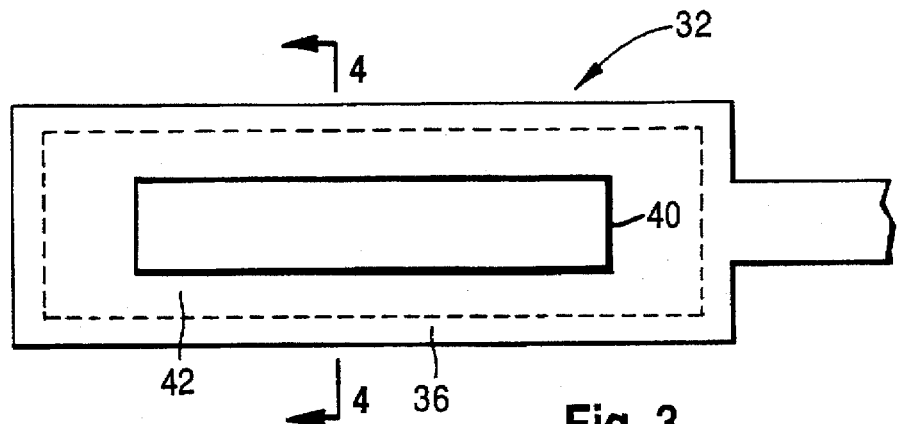
FIG. 3 is a top plan view of a printed circuit board having an electrically conductive edge connector formed thereon in accordance with the present method.
Figure 4:
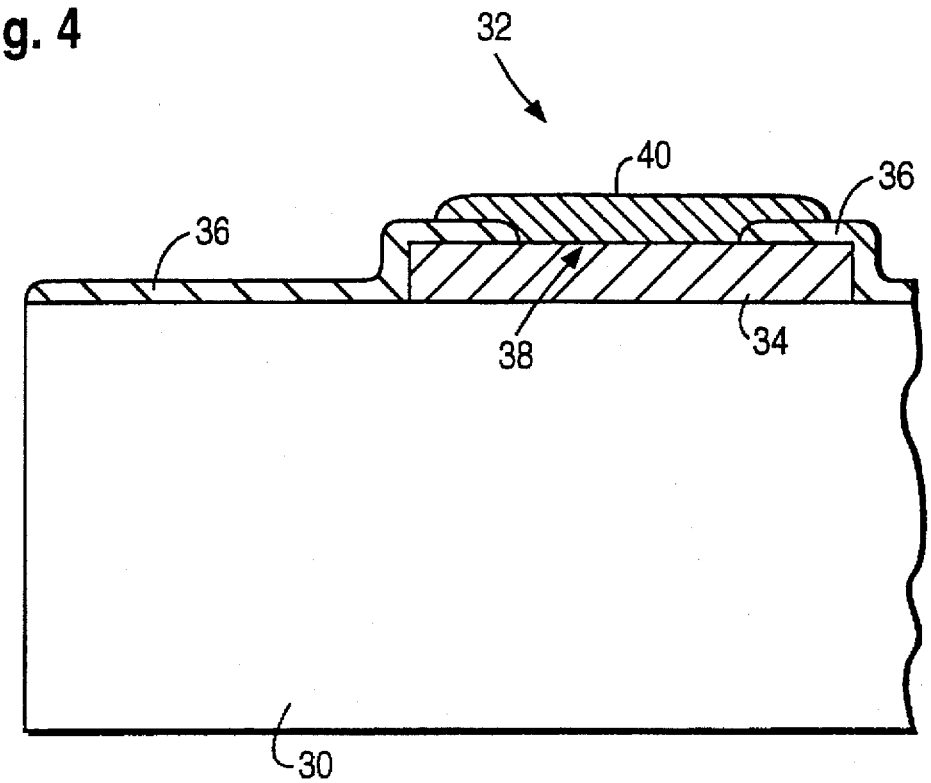
FIG. 4 is a section of the printed circuit board shown in FIG. 3 taken along line 4—4.

As can be seen from FIGS. 3 and 4, a portion of a substrate in the form of a printed circuit board 30 having an edge connectors 32 formed thereon in accordance with the present method is shown. The edge connectors 32 includes copper buss 34 applied to selected areas of the surface of the board. Soldermask 36 covers the areas of the board not covered by the copper buss as well as a portion of the copper buss about its entire periphery to expose the surface of the copper buss in a defined contact area or window 38. TFP conductive paste 40 covers the window 38 and contacts the copper buss 34. The TFP conductive paste also overlies a portion 42 of the soldermask 36. To ensure reliable coverage, the window 38 is dimensioned to be smaller than the TFP conductive paste screen 40 by a minimum of 0.010 inches.

It should however be apparent to those of skill in the art that if the interface between the TFP conductive paste 40 and the copper bus 34 is not an issue, the window 38 formed after application of the soldermask 36 simply needs to be a square of sufficient size to ensure a reliable bond between the TFP conductive paste 40 and the copper buss 34.

Figure 5:
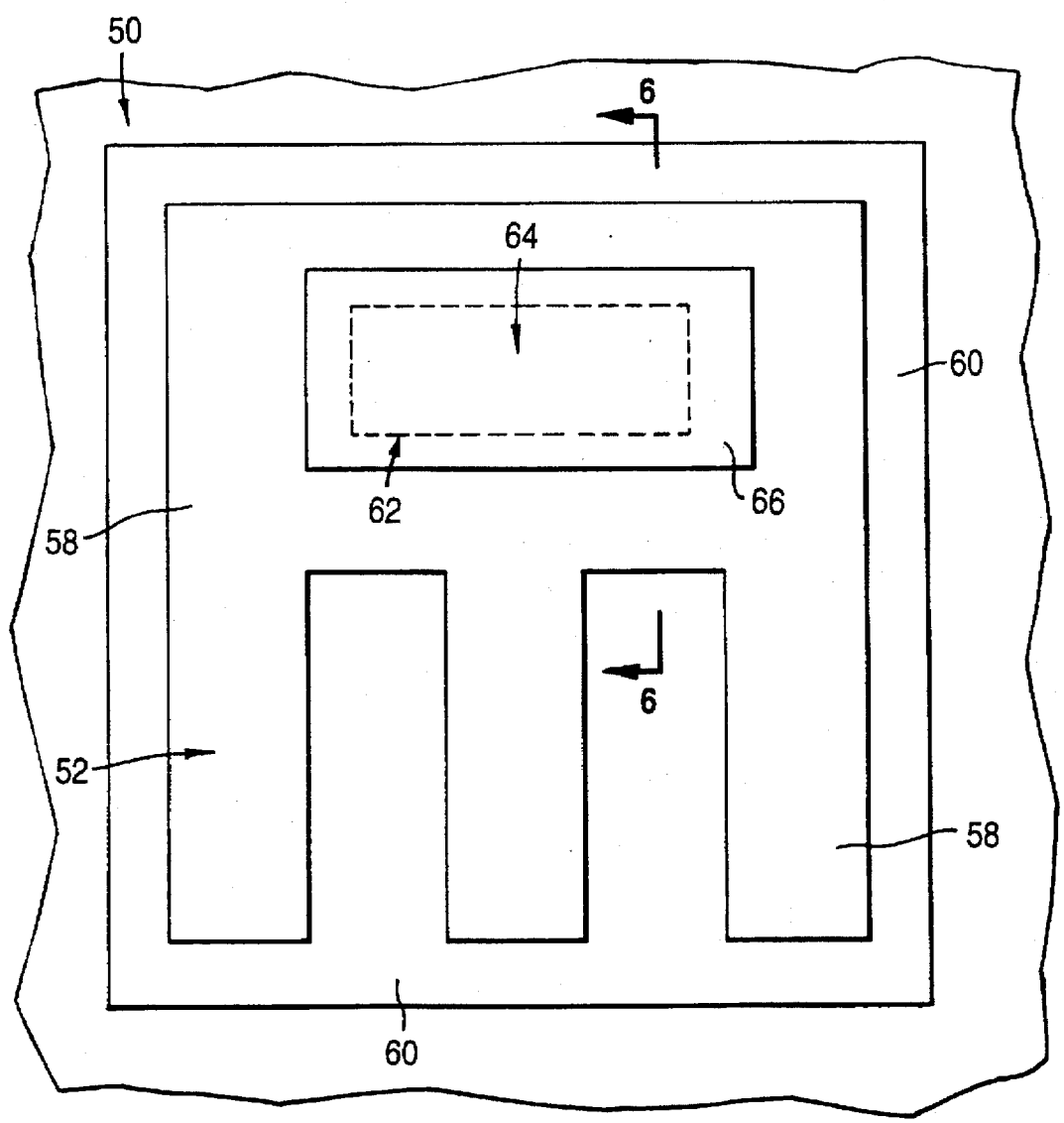
FIG. 5 is a top plan view of a printed circuit board having an electrically conductive switch formed thereon in accordance with the present method.
Figure 6:
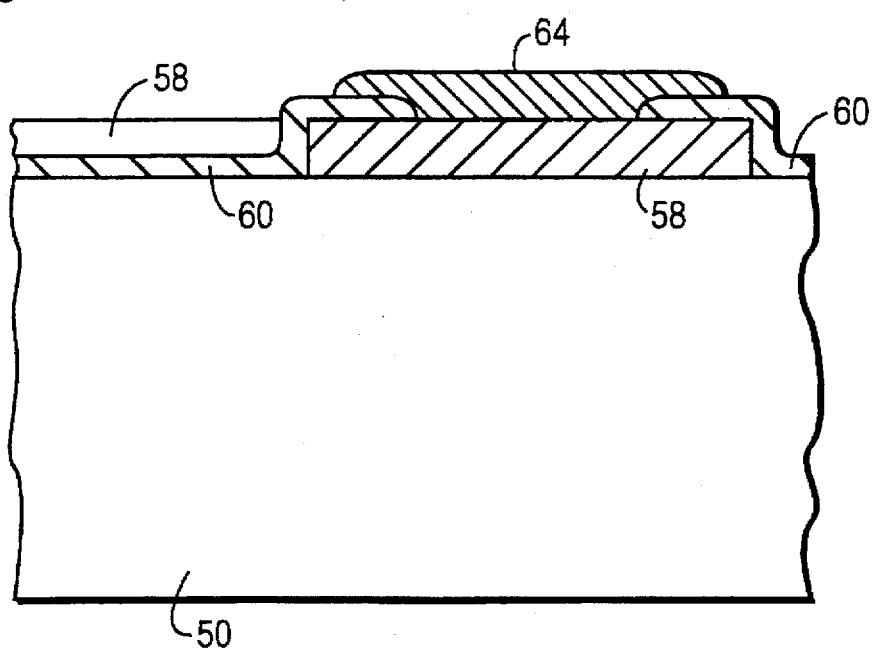
FIG. 6 is a section of FIG. 5 taken along line 6—6.

Referring now to FIGS. 5 and 6, a portion of a PCB 50 having a contact 52 forming part of a low cost switch formed thereon in accordance with the present method is shown. Similar to conventional switches, the contact 52 is used in conjunction with a conductive elastomeric disc (not shown) to form the switch.

The contact includes a copper buss pattern 58 formed on selected areas of the surface of the PCB 50. Soldermask 60 overlies the surface of the PCB 50 not covered by the copper buss as well as areas of the copper buss 58. A window 62 is defined by the soldermask to expose an area of the copper buss. TFP conductive paste 64 covers the window 62 and a portion 66 of the soldermask 60 and contacts the copper buss 58.

Figure 7A:
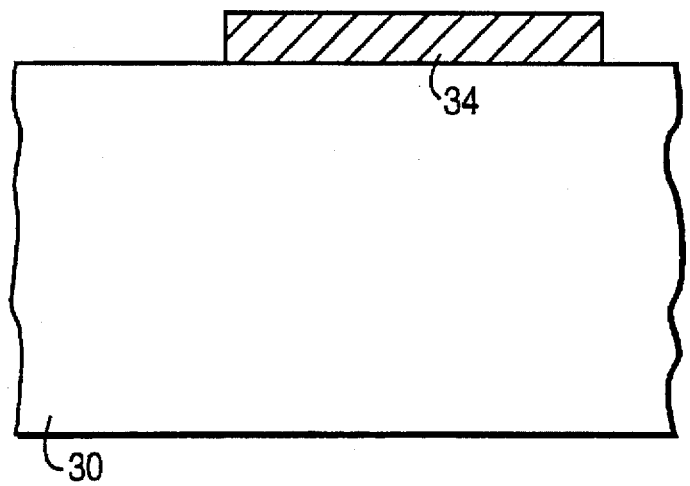
FIGS. 7a, 7b to 7c show sectional views of intermediate forms of the printed circuit board when forming the electrically conductive edge connector of FIG. 3 thereon in accordance with the present method.
Figure 7B:
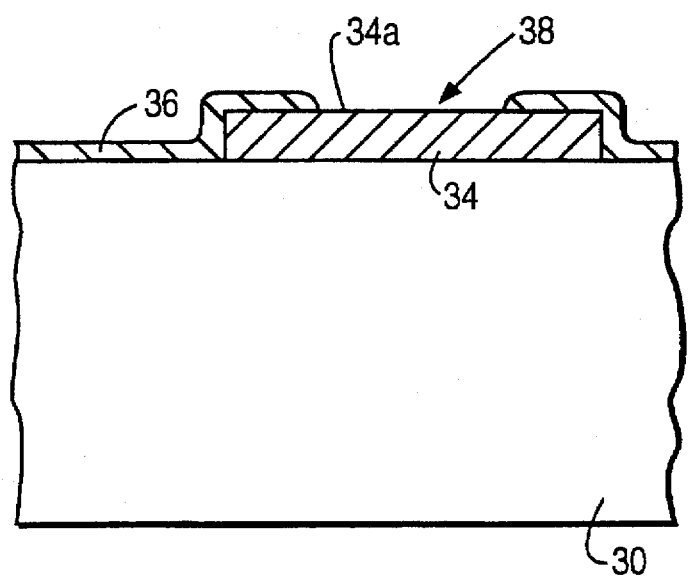
Figure 7C:
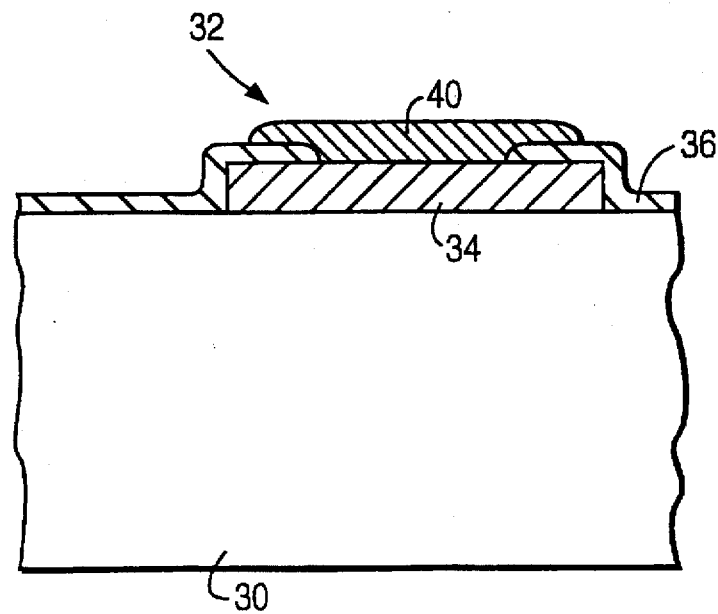

With reference to FIGS. 7a to 7c, the steps involved in forming the edge connector 32 are better illustrated. It should be apparent that when forming the contact 52, similar steps are used. When forming the edge connector 32, the copper buss 34 is applied to cover the selected areas of the substrate 30. Once this is done, the soldermask 36 is applied to the surface of the copper buss 34 in the areas outside of the window 38 as well as portions of the substrate not covered by the copper buss 34. Thereafter, the TFP conductive paste 40 is applied to the upper planar surface 34a of the copper buss 34 exposed by the window and over a small portion of the soldermask 36 via a machine screening process to form the electrically conductive edge connector 32.

Although the present method involves the additional step of coveting the portions of the copper buss not covered by the TFP conductive paste with soldermask, this additional step does not present any problems since, as is known to those of skill in the art, the application of soldermask is used for other reasons during the manufacture of PCBs and, therefore, the addition of this step is easily accommodated without increasing manufacturing costs.

Although the present method has been described as using a machine screening process for the application of the TFP conductive paste on the upper surface of the copper buss, it should be realized that the TFP conductive paste may also be applied manually or by any other suitable application technique. In addition, it should be apparent to those of skill in the art that the present method contemplates the use of other types of conductive pastes and busses and should not be limited to the use of TFP conductive pastes and copper buss.

It should also be apparent to those of skill in the art that although the present method has been described with reference to forming a single electrically conductive contact on a substrate, during typical manufacture of a PCB, multiple TFP screens are defined on the substrate at the same time and each of the materials applied to the substrate associated with each TFP screen are done so simultaneously so that after the last step, namely the application of the TFP conductive paste, multiple electrically conductive contacts are formed on the substrate simultaneously.

As should be appreciated, the present method of forming electrically conductive contacts on a substrate is less complex than prior art techniques thereby simplifying the manufacturing process yet provides for the manufacture of inexpensive and reliable electrically conductive contacts.

We claim:

1. A method of forming a contact on a substrate comprising the steps of:
   (i) applying a conductive buss onto the substrate;
   (ii) applying soldermask to selected areas onto a surface of the conductive buss;

(iii) defining a window by the soldermask on an upper surface of the conductive buss, the window having a periphery which is disposed inwardly from all marginal edges of the conductive buss; and (iv) applying a conductive paste on the upper surface of the conductive buss to substantially completely cover the window.

2. The method defined in claim 1, wherein Step (iv) comprises applying the conductive paste only on the upper surface of the conductive buss to substantially completely cover the window.

3. The method defined in claim 1, wherein the conductive paste covers the window and overlies a portion of the soldermask defining the window.

4. The method defined in claim 3, wherein the conductive paste covers at least 0.010 inches of the soldermask from periphery of the window.

5. The method defined in claim 1, wherein the conductive paste comprises a polymeric conductive paste.

6. The method defined in claim 1, wherein the conductive buss comprises copper.

7. The method defined in claim 1, wherein multiple locations are defined on the substrate and Steps (i), (ii), (iii) and (iv) are individually conducted simultaneously at each location.

8. The method defined in claim 1, wherein Step (iv) comprises applying the conductive paste using a machine screening process.

9. The method defined in claim 1, wherein the upper surface of the conductive buss is substantially planar.

* * * * *